United States Patent
Chou et al.

(10) Patent No.: US 9,046,266 B2
(45) Date of Patent: Jun. 2, 2015

(54) SYSTEM AND METHOD FOR FLAME BLOW-OFF DETERMINATION

(75) Inventors: Chen-Pang Chou, Irvine, CA (US); Devin Hodgson, San Diego, CA (US); Ellen Meeks, Livermore, CA (US)

(73) Assignee: Reaction Design, San Diego, CA (US)

(*) Notice: Subject to any disclaimer, the term of this patent is extended or adjusted under 35 U.S.C. 154(b) by 755 days.

(21) Appl. No.: 12/660,336

(22) Filed: Feb. 23, 2010

(65) Prior Publication Data

US 2010/0332200 A1    Dec. 30, 2010

Related U.S. Application Data

(60) Provisional application No. 61/155,441, filed on Feb. 25, 2009.

(51) Int. Cl.
G06F 17/10 (2006.01)
F23N 5/24 (2006.01)
G06F 17/50 (2006.01)

(52) U.S. Cl.
CPC ............ *F23N 5/242* (2013.01); *G06F 17/5009* (2013.01); *F23N 2041/20* (2013.01); *F23N 2031/28* (2013.01); *F23N 2023/40* (2013.01)

(58) Field of Classification Search
CPC .................................................. F23N 5/242
USPC ............................................................ 703/2
See application file for complete search history.

(56) References Cited

U.S. PATENT DOCUMENTS

| 5,254,368 A | 10/1993 | Kadlec et al. |
|---|---|---|
| 6,663,997 B2 | 12/2003 | Dong et al. |
| 7,337,057 B2 | 2/2008 | Norman et al. |
| 2006/0046218 A1 | 3/2006 | Joklik et al. |
| 2008/0273572 A1* | 11/2008 | Lawrence et al. ............... 374/45 |

OTHER PUBLICATIONS

Reaction Design, "Assessing Lean Blow Off Using Energico," May 21, 2008, Wayback Machine for www.reactiondesign.com/products/open/application_notes.html, on Jan. 1, 2009, pp. 1-6.*
Irvin Glassman et al., "Combustion," fourth edition, 2008, Academic Press, pp. 216, 221, 246.*
Reaction Design, "Reaction Design Launches ENERGIC tm—A Revolutionary New Tool for Clean Combustion Design in Gas Turbine Applications," Sep. 22, 2008, www.reactiondesign.com, two pages.*
Reaction Design, "ENERGICO," 2008, www.reactiondesign.com, four pages.*

(Continued)

*Primary Examiner* — David Silver
*Assistant Examiner* — Russ Guill
(74) *Attorney, Agent, or Firm* — Jones Day

(57) ABSTRACT

Systems and Methods for determining flame blow-off conditions are disclosed. These methods provide efficient and reliable tools for determining the lean blow-off conditions for a variety of combustion system. By utilizing localized characteristics within a flame-holding region a user is enabled to assess the likelihood of flame blow-off with fine granularity within a combustor. The flame blow-out determination may be carried out with the aid of an output representation that provides a contour of likely blow-off cells within a combustor region.

42 Claims, 3 Drawing Sheets
(1 of 3 Drawing Sheet(s) Filed in Color)

(56) References Cited

OTHER PUBLICATIONS

P. Koutmos, "A Damkohler number description of local extinction in turbulent methane jet diffusion flames," 1999, Fuel, vol. 78, pp. 623-626.*

Q. Zhang et al., "Characterization of Fuel Composition Effects in H2/CO/CH4 Mixtures Upon Lean Blowout," 2007, Transactions of the ASME, vol. 129, pp. 688-694.*

William M. Eppard, "CFD Time-Integration Strategies for Large Chemical Systems," 2006, Aerosoft, Inc., 20 pages.*

Chiara Galletti et al., "Numerical and experimental investigation of a mild combustion burner," 2007, Combustion and Flame, vol. 151, pp. 649-664.*

P. Strakey et al., "Investigation of the effects of hydrogen addition on lean extinction in a swirl stabilized combustor," 2007, Proceedings of the Combustion Institute, vol. 31, pp. 3173-3180.*

Raphael Fuchs et al., "Parallel vectors criteria for unsteady flow vortices," May 2008, IEEE Transactions on Visualization and Computer Graphics, vol. 14, No. 3, pp. 615-626.*

Hiroshi Akiba et al., "Visualizing multivariate volume data from turbulent combustion simulations," 2007, Computing in Science and Engineering, Mar./Apr. 2007, pp. 76-83.*

Anton Fuhrmann et al., "Real-time techniques for 3d flow visualization," 1998, Proceedings of the Conference on Visualization 1998, pp. 305-312.*

Qin Shen et al., "Data level comparison of wind tunnel and computational fluid dynamics data," 1998, Proceedings of the IEEE Visualization Conference 1998, five pages.*

Ira N. Levine, "Physical Chemistry," fourth edition, 1995, McGraw-Hill, p. 517.*

B. Wayne Bequette, "Process Control Modeling, Design, and Simulation," 2003, Prentice Hall, pp. 32, 42, 67.*

Kuangyu Shi et al., "Visualizing transport structures of time-dependent flow fields," Oct. 2008, IEEE Computer Graphics and Applications, pp. 24-36.*

S.H. Chung et al., "Local Extinction Karlovitz Number For Premixed Flames," 1996, Combustion and Flame, vol. 106, pp. 515-520.*

P. Koutmos, "Simulations of localized extinction in turbulent CH4 jet flames using a lagrangian model for reactedness," 2000, Acta Astronautica, vol. 46, No. 1, pp. 47-53.*

Paul E. Dimotakis, "Some issues on turbulent mixing and turbulence," 1993, GALCIT Report FM93-1, pp. 1-34.*

Irvin Glassman et al., "Combustion," fourth edition, 2008, Academic Press, pp. 147-260, 311-377.*

Extended European Search Report and Written Opinion, dated Jul. 18, 2014 from related / corresponding EP 10746785.4 filed Feb. 24, 2010 and PCT Patent Application Serial PCT/US2010/025269, filed Feb. 24, 2010.

Reaction Design, "Assessing Lean Blow Off Using Energico", May 21, 2008, EAPP-LBO (v1.0), 6 pages.

Dinkelacker, Friedrich, "Turbulente Verbrennung", Apr. 20, 2007, DPG—Arbeitskreis Energie—Bad Honnef, 29 pages.

Koutmos, P., "A Damkohler number description of local extinction in turbulent methane jet diffusion flames", Department of Mechanical Engineering, University of Patras, Patras, Rio Greece, Apr. 8, 1998, pp. 623-626.

Copy of International Search Report for PCT Application No. PCT/US2010/025269 dated Apr. 21, 2010.

* cited by examiner

SYSTEM AND METHOD FOR FLAME BLOW-OFF DETERMINATION

CROSS-REFERENCE TO RELATED PATENT APPLICATIONS

This application claims priority from U.S. Provisional Application Ser. No. 61/155,441, filed Feb. 25, 2009, incorporated herein by reference in its entirety for all purposes.

FIELD OF INVENTION

This invention relates to combustion systems. In particular, the present invention relates to systems and methods for providing an accurate flame blow-off determination in combustion systems.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Design of combustion systems is a complicated process that requires an in-depth knowledge and resolution of several factors, such as complex geometry, turbulent flow patterns, heat transfer and complex combustion-related chemistry. In order to design a safe and efficient combustion system, it is critical to accurately monitor and control the various aspects of the combustion process. In particular, the monitoring and prediction of environmental pollutants have become very important in the design of modern combustors. These pollutants may include nitrogen oxides ($NO_x$), carbon monoxide (CO), carbon dioxide ($CO_2$) and unburned hydrocarbons (UHC), and are subject to strict environmental emission regulations.

One of the strategies adopted by many modern gas turbine combustors for suppressing the emission of $NO_x$, CO, $CO_2$, UHC and other pollutants is to operate with a tightly controlled fuel/air ratio. In particular, a system with a very fuel-lean premixed flame (i.e., a dry low emission technology) is often utilized. The goal of such a system is to make the premixed flame as lean as possible without going below the Lean Blow-Off (LBO) limit. LBO is the point beyond which the fuel-air mixture is no longer flammable. Thus the desire to operate near the LBO limit must be balanced against the undesirable consequences of flame instability or extinction. In practice, fuel-lean premixed flames are very sensitive to their surrounding environment, and as such, it is advantageous to be able to efficiently and accurately assess the variations in the environment and fuel compositions in order to predict and monitor the LBO conditions. Furthermore, as the popularity of 'opportunity' fuels increases, engine designers may be routinely required to verify the impact of alternative fuels on operability, efficiency and emissions associated with the various combustion engines.

SUMMARY OF THE INVENTION

The methods and systems of the present invention enable accurate and confident determination of flame blow-off conditions in a broad spectrum of combustion systems. One aspect of the present invention relates to a method for determining flame blow-off conditions in a combustor, comprising selecting a plurality of cells from a region within the combustor, obtaining a plurality of Damköhler numbers in accordance with detailed combustion chemistry and detailed flow dynamics associated with each of the plurality cells, providing an output representation associated with the Damköhler numbers, and determining flame blow-off conditions in accordance with the output representation.

As used herein, "determining" may refer to ascertaining, calculating, computing, measuring, perceiving and/or a combination thereof. Determining may be carried out to assess the presence or absence of certain parameters and/or conditions. For example, determining may be carried out to assess the presence or absence of flame blow-off conditions.

As used herein, "flame blow-off" refers to the static instability limit of a combustion system, and it may refer to a limit beyond which a flame fails to be anchored at a designated location within a combustor.

As used herein, "combustor" may refer to a component, an area or a chamber where combustion of a mixture of fuel-oxidant takes place. A combustor is designed to contain and control the burning fuel-air mixture and, for example, may be a part of a gas turbine, ramjet or pulsejet engine.

As used herein, "selecting" may refer to the manual or automatic selection of one or more cells from a region of a combustor. The selecting may be carried out by a user at his/her own discretion or based on a selection criteria. Additionally, or alternatively, the selecting may be conducted automatically via a software, hardware or firmware component. The selecting may further be performed according to a sampling method that provides a random or pseudo-random selection process and/or in accordance with a predefined probability distribution, such as uniform probability, Gaussian probability distribution and the like.

As used herein, "cell" refers to an element within a region of the combustor. A cell, for example, may represent a volume equivalent to approximately a cubic millimeter to a cubic centimeter. A region of a combustor may comprise as many or as few cells necessary to allow determination of flame blow-off conditions.

As used herein, "region" may refer to an area or volume of the combustor. A region may comprise a plurality of cells. A combustor may comprise one or more regions that are selected by a user and/or automatically via a software, hardware or firmware component.

As used herein, "Damköhler number" refers to a dimensionless number that is used to relate chemical reaction timescale to other phenomena occurring in a combustion system. It is named after the German chemist Gerhard Damköhler, 1908-1944. For example, the Damköhler number may represent the ratio of chemical kinetic time, representing the time required for a combustion-related chemistry reaction to take place under the conditions of a particular region of the combustor, to the residence time, representing the average time that flowing gas molecules reside within that particular region.

As used herein, "detailed combustion chemistry" refers to a complex sequence of chemical reactions between a fuel and an oxidant accompanied by the production of heat or both heat and light.

As used herein, "detailed flow dynamics" refers to the complex dynamics of substances that flow. Detailed flow dynamics may be determined using, for example, Computational Fluid Dynamics (CFD), that utilizes numerical methods and algorithms to solve and analyze problems that involve flow of gasses and liquids. In conducting such analysis, computers may be used to perform the millions of calculations required to simulate the interaction of fluids and gases with the complex surfaces of the combustor.

As used herein, "output representation" may refer to an output that is perceptible to user, and may be utilized, for example, to assess flame blow-off conditions. For example, an output representation may comprise a plurality of two- or three-dimensional plots, contours or diagrams. The output representations may be color-coded, or otherwise structured, to allow identification or one or more parameters, as well as the range of values associated with such parameters. Such parameters may, for example, comprise a Damköhler number, a critical Damköhler number and/or a probability associated with producing a flame blow-off condition. The output representation may be exhibited on an electronic display, such as a computer monitor or a television, or may be printed on a medium, such as a paper. The output representation may further be stored on a tangible computer readable medium, such as a Read Only Memory (ROM), Random Access Memory (RAM), compact discs (CDs), digital versatile discs (DVD), etc.

According to one embodiment of the present invention, one or more of the cells is selected in accordance with a sampling method, and in another embodiment, the maximum number of cells to be considered is a user defined parameter.

As used herein, "sampling" refers to the selection of one or more samples, which may include the selection of some or all of the samples. The sampling may be carried out manually by a user, or automatically using a software, hardware or firmware component. The sampling may be carried out according to a statistical definition and/or in accordance with a sampling probability distribution, such as a uniform probability, Gaussian probability distribution and the like. The sampling may further produce a random or a pseudo-random selection of the samples. Alternatively, or additionally, the sampling may be performed based on a user's discretion and/or according to a specific criteria.

According to another embodiment of the present invention, at least one of the cells is selected from at least one of a flame and a pre-flame zones within said combustor.

As used herein, "flame zone" refers to a region of a combustor where a flame may reside.

As used herein, "pre-flame zone" may refer to a region of a combustor that is located before, or downstream from, a flame zone. The pre-flame zone, for example, may be located at a location that is closer to the fuel and/or oxidant inlets than the flame zone.

In one embodiment, the flame and pre-flame zones are defined by a user while in another embodiment, the flame and pre-flame zones are determined in accordance with computational fluid dynamics (CFD) computations.

As used herein, "Computational Fluid Dynamics" refers to using numerical methods and algorithms to solve and analyze problems that involve flow of gasses and liquids. In conducting such analysis, computers may be used to perform the millions of calculations required to simulate the interaction of fluids and gases with the complex surfaces of the combustor.

In one embodiment, each of the Damköhler numbers is obtained by dividing a chemical time by a residence time associated with each cell. In another embodiment, the residence time is selected in accordance with at least one of a mean flow residence-time value or a turbulent flow timescale value associated with a cell.

As used herein, "mean flow residence-time value" refers to the mathematical mean or average value associated with the flow residence time. For example, mean flow residence-time value may be obtained by dividing the cell length by the magnitude of mean velocity of the mixture flow.

As used herein, "turbulent flow timescale value" refers to the value of flow timescale that is obtained when turbulence is taken into consideration. The value of turbulent flow timescale may be obtained, for example, from CFD computations.

As used herein, "turbulence" or "turbulent" may refer to a fluid regime characterized by chaotic, stochastic property changes. This may include low momentum diffusion, high momentum convection, and rapid variation of pressure and velocity in space and time. Turbulence may cause the formation of eddies of many different length scales. An eddy may be referred to as the swirling of a fluid or gas/fluid mixture and the reverse current created when the fluid flows past an obstacle. The moving fluid may create a space devoid of downstream-flowing fluid on the downstream side of the object. Fluid behind the obstacle flows into the void, creating a swirl of fluid on each edge of the obstacle, followed by a short reverse flow of fluid behind the obstacle flowing upstream, toward the back of the obstacle.

In another embodiment, the residence time is selected to be the minimum of the mean flow residence-time value and the turbulent flow timescale value. In still another embodiment of the present invention, the mean flow residence value is obtained by (1) dividing the volume of the cell by cross-flow area associated with the cell, then (2) dividing the resulting value by the magnitude of mean flow velocity of the mixture.

As used herein, "cross-flow area" may refer to an area that is available for flow. For example, the cross-flow area may comprise the minimum flow area associated with a cell within a region of a combustor.

In another embodiment, the turbulent flow residence timescale value is obtained in accordance with turbulence kinetic energy and dissipation function associated with the cell.

As used herein "turbulence kinetic energy" may refer to the mean kinetic energy per unit mass associated with eddies in a turbulent flow. The kinetic energy is the energy of an object due to its motion, and may be defined as the work needed to accelerate a body of a given mass from rest to its current velocity.

As used herein, "dissipation function" may refer to turbulent dissipation associated with a cell. The K-epsilon model is one of the most common turbulence models. The first variable, K, is the turbulence kinetic energy and the second variable, epsilon, is the turbulent dissipation. For example, epsilon may determine the scale of the turbulence, whereas K may determine the energy in the turbulence.

In another embodiment, the chemical time is obtained by dividing a change in sensible enthalpy by a heat release rate associated with a cell.

As used herein, "sensible enthalpy" may refer to the energy required to take a fluid, gas, or a mixture thereof, from one temperature state to another. For example, sensible enthalpy may be calculated as the energy required to change the temperature of a fluid that is at 25° C. to another temperature, T.

As used herein, "heat release rate" refers to the rate at which heat is released. For example, heat release rate may be expressed, calculated or measured as Joules per Second, or a Watt.

According to another embodiment of the present invention, the determining is carried out in accordance with a critical Damköhler number. In one embodiment, the critical Damköhler number is one, while in another embodiment, the critical Damköhler number is a user-defined value.

As used herein, "critical Damköhler number" may refer to a value associated with a Damköhler number that is of special importance. For example, a critical Damköhler number may represent an onset of flame blow-off condition.

According to another embodiment, the output representation comprises a contour of Damköhler numbers associated with each cell.

As used herein, a "contour" may refer to constant-valued points on a two- or three-dimensional map of numbers or values. A contour may also refer to contour lines on a map that joins points of equal value, or a collection of such lines that comprise a map. Contour lines may be curved or straight lines on a map. The configuration of the contours may allow an observer to infer relative gradient of a parameter and estimate that parameter at specific places.

In yet another embodiment, the output representation comprises cells with Damköhler numbers that are greater than a critical Damköhler number. In still another embodiment, the output representation comprises a likelihood measure associated with producing flame blow-off with cell-level granularity.

As used herein, "likelihood measure" may refer to a probability or statistical quantity that is associated with a value or occurrence. The likelihood measure, for example, may quantify how likely is the occurrence of an outcome. The likelihood measure may be represented by discrete values or options. For example, a likelihood measure may be either a zero or a one (or a 'No' or a 'Yes'), or any discrete or quantifiable values between an upper and a lower value. The likelihood measure may also comprise a continuous range of values or options. The likelihood measure may also be expressed as a function of other parameters and/or variables.

In another embodiment of the present invention, the output representation comprises residence and chemical times, and in yet another embodiment, the output representation is used to assess flame stability within the region.

As used herein, "flame stability" may refer to the extent within which a flame is stable and/or sustainable. Flame stability may be assessed, for example, by examining Damköhler numbers associated with the cells within a region of a combustor.

Another aspect of the present invention relates to a computer program product embodied on a computer-readable medium, comprising a computer code for selecting a plurality of cells from a region within a combustor, a computer code for obtaining a plurality of Damköhler numbers in accordance with detailed combustion chemistry and detailed flow dynamics associated with each of the plurality cells, a computer code for providing an output representation associated with the Damköhler numbers, and a computer code for determining flame blow-off conditions in accordance with the output representation.

As used herein, "computer program product" may refer to a computer program, including, but not limited to, computer-executable instructions, such as program code, that is executed by computers in stand-alone or networked environments.

As used herein, "computer-readable medium" may refer to a non-transitory and non-transmissible medium that is adapted to carry information and/or instructions, which may be accessed (e.g., read, written, modified, or erased) using a computer. A computer readable medium may include removable and non-removable storage devices including, but not limited to, Read Only Memory (ROM), Random Access Memory (RAM), compact discs (CDs), digital versatile discs (DVD), etc.

As used herein, "program code" may refer to computer-executable instructions that may be independently executable, be part of a larger program module or comprise a plurality of program modules. A program module may include routines, programs, objects, components, data structures, etc. that perform particular tasks or implement particular abstract data types. Computer-executable instructions, associated data structures, and program modules represent examples of a program code.

In another aspect of the present invention, a system for determining flame blow-off conditions in a combustor is disclosed, comprising receiving information indicative of a likely flame-holding region within the combustor, selecting a plurality of cells from the region, obtaining a plurality of Damköhler numbers in accordance with detailed combustion chemistry and detailed flow dynamics associated with each of the plurality of cells, providing an output representation associated with the Damköhler numbers, and determining flame blow-off conditions in accordance with the output representation.

These and other advantages and features of various embodiments of the present invention, together with the organization and manner of operation thereof, will become apparent from the following detailed description when taken in conjunction with the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of necessary fee.

Embodiments of the invention are described by referring to the attached drawings, in which.

DETAILED DESCRIPTION OF CERTAIN EMBODIMENTS

Figure 1:
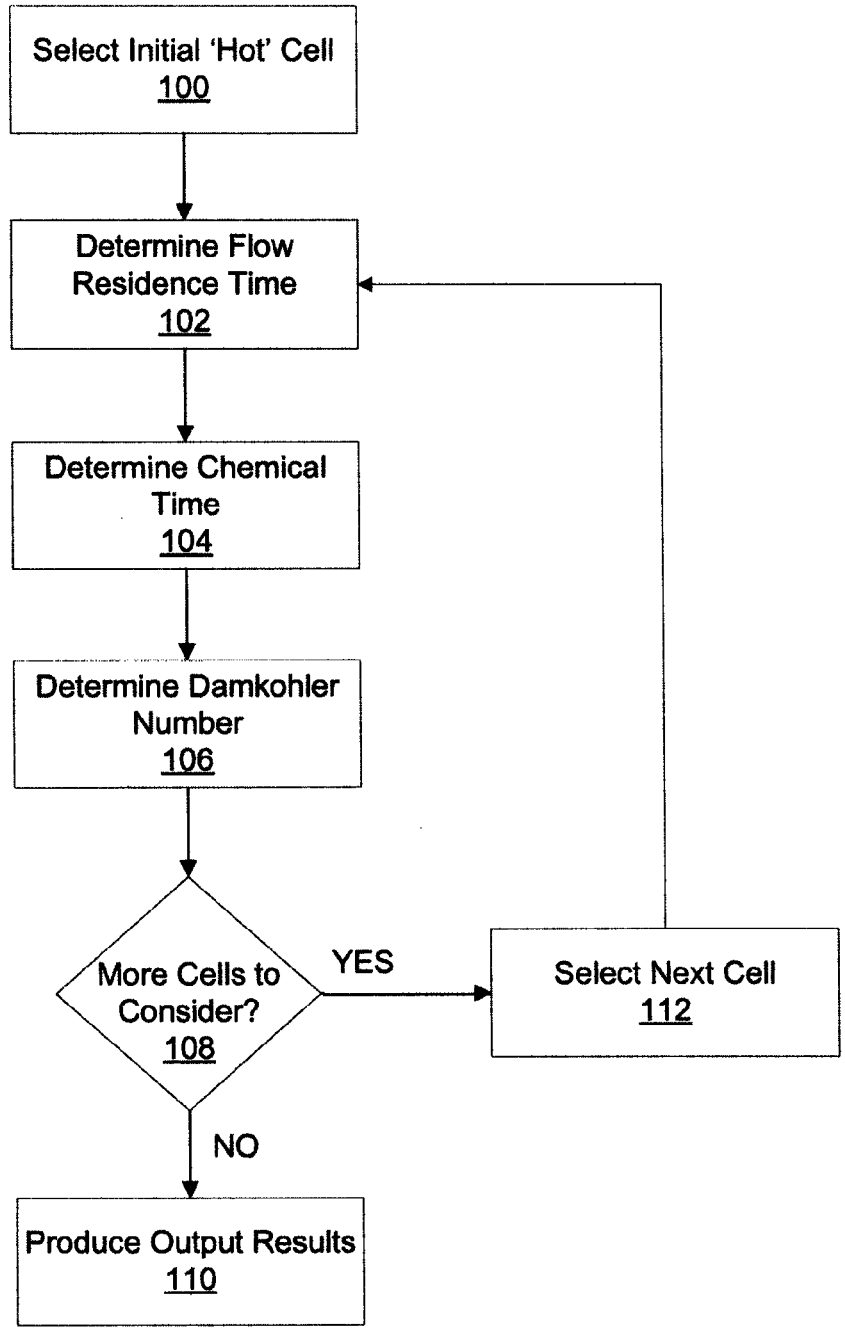
FIG. 1 illustrates a block diagram in accordance with an exemplary embodiment of the present invention.

In the following description, for purposes of explanation and not limitation, details and descriptions are set forth in order to provide a thorough understanding of the present invention. However, it will be apparent to those skilled in the art that the present invention may be practiced in other embodiments that depart from these details and descriptions.

Blow-off is the static instability limit of a combustion system, and it refers to a limit beyond which a flame fails to be anchored at a designated location within the combustor. Blow-off often occurs when the heat generated by the reaction is no longer sufficient to ignite the flow of fuel-air mixture. In uncontrolled combustion systems, the combustion is limited by the degree of mixing that occurs within the combustor since the chemical reaction time is typically much faster than the dynamic mixing time. However, as the flame temperature is decreased, the chemical reaction time slows down to a point where it becomes the limiting factor, potentially leading to an flame blow-off condition. The assessment of the flame blow-off may be carried out using the dimensionless Damköhler number, Da, that is represented by Equation (1):

$$Da = \frac{\tau_{chem}}{\tau_{res}}. \qquad \text{Equation (1)}$$

In Equation (1), $\tau_{chem}$ is the chemical kinetic time, representing the time required for a combustion-related chemistry reaction to take place under the conditions of a particular region, and $\tau_{res}$ is the residence time, representing the average time that flowing gas molecules reside within that particular region. As such, a Damköhler number represents physical characteristics of a flame in the region of interest. For example, a Damköhler number close to 1 indicates a region near flame blow-off conditions. If the chemical time is longer than the residence time (i.e., when Da is greater than 1), blow-off is more likely to occur since the unburned fuel-air mixture has a tendency to leave the region before it has a chance to ignite. Damköhler number has been found to reasonably capture the influence of fuel variation on blow-off trends. However, the critical Damköhler number may vary from one combustor configuration to another.

The main challenge associated with using the Damköhler number is to identify the proper chemical and residence times associated with various combustor regions. One method for calculating the chemical time for a premixed laminar flame can be carried out using Equation (2):

$$\tau_{chem} = \frac{\alpha}{S_L^2}, \qquad \text{Equation (2)}$$

where, $S_L$ and $\alpha$ represent laminar flame speed and mixture's thermal diffusivity. Note that 'diffusivity' and 'thermal conductivity' are proportional to one another, and therefore, either of the two entities may be used in Equation (2) to evaluate the chemical time. While Equation (2) may provide a reasonable estimate for chemical times associated with combustors with single inlet and uniform fuel-to-oxidant mixtures, it may not be well-suited for combustors with non-uniform inlet equivalence ratios or combustors with several inlets with different fuel compositions. The current methods for calculating the residence times are similarly prone to oversimplification of the flow mechanics within the modern combustors.

In order to make a more accurate assessment of flame blow-off conditions, detailed analysis of both the flow field and the chemistry of the combustion system must be taken into consideration, since blow-off is inherently a local phenomena. In accordance with an embodiment of the present invention, a method for accurate and reliable determination of Damköhler number is effected by utilizing flow and thermo-chemical properties of the fuel mixture, as well as detailed combustion kinetics in a localized fashion. As such, instead of attempting to find and use global chemical and residence times, these values are obtained and applied locally, thus accounting for spatial variations of mean flow, turbulence, and fuel mixture properties associated with practical combustion systems.

The methods and systems in accordance with various embodiments of the present invention utilize computational fluid dynamics (CFD) analysis conducted over individual cells that are combined with detailed combustion chemistry calculations to accurately estimate combustion behavior. Since flame blow-off conditions are very sensitive to turbulence effects, the methods in accordance with various embodiments of the present invention can readily utilize turbulence parameters from CFD calculations conducted over each cell. Furthermore, since blow-off is unlikely to be an issue for most of the combustor flow field, blow-off determination may be advantageously confined to flame stabilization regions, and to some extent, to pre-flame regions towards the fuel/air inlets.

FIG. 1 illustrates a block diagram for determination of flame blow-off conditions in accordance with an exemplary embodiment of the present invention. The flame blow-off determination is initiated by selecting a "hot" CFD cell from a combustion zone in the flame-holding region of the combustor (step 100). In one exemplary embodiment, a zone may comprise five to ten million cells, and thus, depending on the scale of the combustor, a cell may represent a volume equivalent to approximately a cubic millimeter to a cubic centimeter. The selected hot or burning cell may be obtained using, for example, a reduced chemistry, mix-is-burned combustion model, such as an eddy break-up model, a flamelet model, or a one-step fast chemistry model. Each of these methods severely compromises the accuracy of the chemistry representation. The flamelet CFD model, for example, simplifies the model by decoupling the fluid dynamics and chemistry associated with the combustion. Thus, while complex fluid dynamics calculations associated with the combustor are retained, the chemistry is calculated separately and all properties linking chemistry to fluid dynamics are typically stored and retrieved through lookup tables. This way, the time required for calculations is reduced. However, the accuracy of the chemical information predicted by such an approach is also greatly diminished. Other methods simplify the chemistry representation even more drastically. One-step or multi-step (typically 2-8 steps) reduced-chemistry models include neither the elementary reaction steps, nor the trace radical species involved in stabilizing flames or in determining if ignition will take place. Therefore they cannot predict flame-stability phenomena. A mixed-is-burned model is even simpler in that it assumes that only the degree of turbulent mixing between the fuel and oxidant determines if a flame exists, completely neglecting any kinetics effects. Although the burning cell that is initially selected in accordance with the above noted models may not accurately represent the actual conditions within the selected zone, the predicted flame zone, nonetheless, it corresponds to an approximate region where the flame would settle if a stable lean flame in fact existed in the combustor. It is therefore reasonable to use such simulations as a starting point. The subsequent flame blow-off analysis, using a detailed chemistry solution, ultimately reveals whether an ideal flame can survive in the specified region. The reduced chemistry CFD approach provides reasonable estimates of velocity, temperature, and composition of the fresh fuel-air mixture entering the flame zone, which is all that is required for the flame blow-off, detailed-chemistry simulation.

Identification of a flame zone may be accomplished in accordance with a pre-defined and/or a user-defined definition of a 'flame.' Flame definitions may be derived from the CFD solution according to, for example, the CFD-predicted, local cell values for temperature, temperature gradient (i.e., local rate at which temperature is changing relative to the geometrical coordinates), fuel/oxidizer/combustion-products mass fractions (i.e., the cell-local mass-based fractional concentration of fuel/oxidant or other species such as $CO_2$, $H_2O$ and the like), or mixture fraction/progress value. Mixture fraction is defined as the elemental mass fraction that originated from the fuel stream. It is often calculated as the ratio of the difference between the local (cell) fuel mass and the total inlet oxidant mass fraction, divided by the difference between the total fuel inlet mass fraction and the total inlet oxidant mass fraction. Fuel mixture fraction is a common parameter used in tracking the extent of combustion in CFD simulations. In addition, the knowledge of the species representing the fuel, as well as the axis most closely aligned with the main flow direction may be required. In one exemplary embodiment, an 'upwind' flame may be defined as comprising cells that share one or more of the following characteristics: a strongly negative temperature gradient with respect to the cells' velocity vector, a strongly positive fuel gradient with respect to the cells' velocity vector, and a location within the first 50% of the combustor geometry (i.e., the "upwind" half of the combustor or the half of the combustor closest to the inlets and farthest from the exhaust), as defined by the choice of axis aligned with the dominant flow direction. In another example embodiment, a 'downwind' flame may be defined as comprising cells that share one or more of the following characteristics: a strongly positive temperature gradient with respect to the cells' velocity vector, a strongly negative fuel gradient with respect to the cells velocity vector, and a location within the first 50% of the combustor geometry, as defined by the choice of axis aligned with the dominant flow direction. In yet another exemplary embodiment, an 'upwind-and-downwind' flame may be defined that combines the characteristics of both upwind and downwind flame types into a single flame. Additionally, or alternatively, a user may be able to define his/her own method for defining a flame using a combination of the above-noted conditions and/or additional criteria.

Referring back to FIG. 1, upon selection of the initial hot cell, the flow residence time for the selected cell may be determined (step 102). This determination may be done, for example, in accordance with two different fluid dynamic processes. In one method, a mean flow residence time may be defined, for example, by dividing the cell length by the magnitude of mean velocity (e.g., at the center of the cell). The velocity value may be obtained from the CFD results associated with the cell, and the cell length may be obtained, for example, by dividing the cell volume by cross-flow area associated with the cell. In another method relating to turbulent flows, the residence time may be obtained, as a large eddy turnover time value or a scalar mixing time value, from the turbulence kinetic energy, k, and dissipation function, E, which are obtained from the CFD solution. Eddy turnover time and scalar mixing times are timescales associated with CFD-calculated turbulence parameters that depend on the turbulence model being used in the CFD simulation. The eddy turnover time, for example, is usually defined as the longitudinal integral length scale divided by the square root of the turbulent kinetic energy (see, for example, Rodney O. Fox, "Computational Models for Turbulent Reacting Flows," Cambridge University Press, 2003, p. 38). The values for k and $\epsilon$ are also obtained from the CFD results associated with the cell. In one exemplary embodiment, residence time in accordance with both of the above-noted methods are obtained, and the characteristic flow residence time for the cell is selected to be the smaller of the two values. In another exemplary embodiment, both values may be retained and carried out to compute the flame blow-off conditions. In such a scenario, the user may be presented with two choices of blow-off conditions, each associated with a different method for obtaining the residence time.

Figure 2:
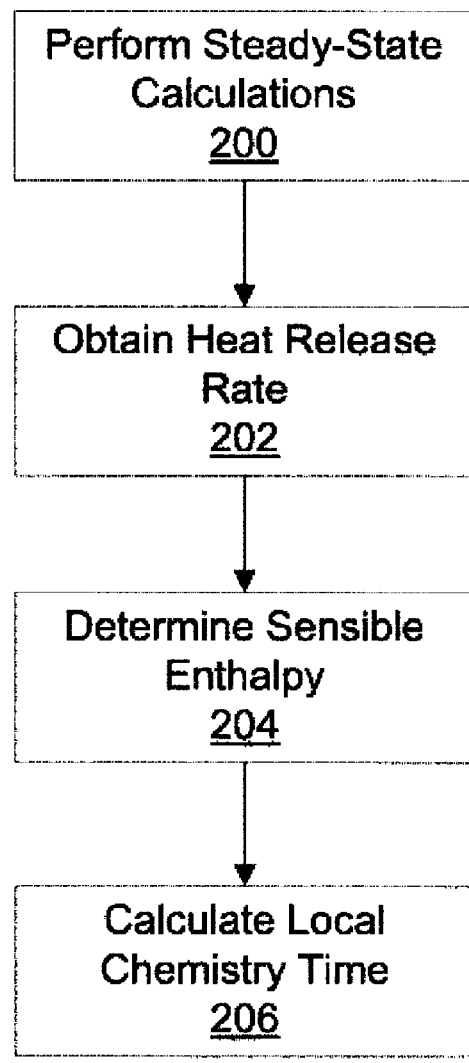
FIG. 2 illustrates a block diagram in accordance with an exemplary embodiment of the present invention.

The next step involves determining the chemical time for the selected cell, as illustrated in step 104 of FIG. 1 A block diagram for determining the chemical time in accordance with an exemplary embodiment of the present invention is further illustrated in FIG. 2. First, a set of steady-state, adiabatic calculations are conducted on the selected cell (step 200), accounting for all net incoming fluxes to the cell. The cell may be treated approximately as a stirred reactor, where energy and mass balance equations are solved with some net flow of mass through the cell, based on the information obtained from the CFD flow solution. Step 200 is conducted to determine the detailed thermochemical state of the cell under the most favorable heat and mass-transfer scenario (i.e., favorable to flame stability). At the completion of step 200, the detailed gas composition and 'true' cell temperature are obtained from the steady-state cell calculations with detailed combustion kinetics. In step 202, the mean heat release rate, Q, is obtained using species composition and temperature that results from the detailed chemistry simulation. In step 204, the sensible enthalpy difference between the detailed-chemistry state and a complete-combustion state, delta H, is computed and used to determine an appropriate chemical time for the cell (step 204). The calculation of chemical time (step 206) may be carried out in accordance with Equation (3):

$$\tau_{chem} \approx \frac{|\Delta H_{mixture}|}{|Q|}, \quad \text{Equation (3)}$$

where, Q is the heat release rate, and $\Delta H_{mixture}$ is the sensible enthalpy change for the steady-state computations. Sensible enthalpy" may refer to the energy required to take a fluid, gas, or a mixture thereof, from one temperature state to another. For example, sensible enthalpy may be calculated as the energy required to change the temperature of a fluid that is at 25'C to another temperature, T. The sensible enthalpy change is the difference of sensible enthalpy between the complete combustion for the available fuel-oxidant mixture and the current steady-state gas mixture obtained from the cell calculation. Sensible enthalpy change is defined as just the enthalpy associated with taking a composition of gas from one temperature to another, excluding any enthalpy associated with the chemical conversion of one set of molecules to another in the change of composition. The heat release rate, on the other hand, represents the enthalpy release due to the chemical kinetics. The heat release rate refers to the rate at which heat is released. For example, heat release rate may be expressed, calculated or measured as Joules per Second, or a Watt. Note, that when a cell is chemically inactive (i.e., heat release rate is approximately zero), $\tau_{chem}$ becomes very large (i.e., approaching infinity) and thus care must be taken for accommodating and properly interpreting the associated large Damköhler number.

Referring back to FIG. 1, it should be noted that the determination of chemical time is shown to occur after the determination of residence time. However, it is understood that these steps may be carried out concurrently, or in the reverse order. Once the residence and chemical times are obtained, Damköhler number associated with the cell may be computed in accordance with Equation (1) (step 106). Next, it is determined whether or not additional cells should be considered for similar calculations (step 108). If the answer is a yes, the next cell is selected (step 112), and steps 102 to 108 are repeated for the newly selected cell. In one example embodiment, the number of cells to be considered may be a user-defined parameter. Thus, for example, in each iteration of the loop, comprising steps 102 to 108, a counter may keep track of the total number of cells processed. In another example embodiment, all cells comprising the selected flame may be analyzed. Once an adequate number of cells have been processed, an output representation corresponding to the Damköhler numbers may be produced (step 110).

In accordance with an example embodiment of the present invention, selecting the next cell (step 112) may be accomplished in accordance with an appropriate sampling method. The sampling technique may simply comprise processing every cell within a designated area (e.g., a flame or pre-flame zone) or processing every cell that is specified by the user. Alternatively, the cell selection process may comprise sampling a subset of cells within a particular zone of interest. The sampling may be carried out in accordance with an appropriate statistical sampling technique to ensure the selected samples (both in terms of their numbers and locations) provide a valid representation of the region of interest. In one example embodiment, a random sampling of cells within a zone may be conducted.

The Damköhler numbers obtained in accordance with step 106 of FIG. 1 may be used to assess the likelihood of flame blow-off conditions at one or more locations within a targeted zone. To this end, a critical Da value may be defined to designate the onset of flame blow-off. For example, this critical value may be set to 1 to represent the condition where the residence time and chemical time are equal. However, the critical Da value may be set to a different value in accordance with the results obtained from detailed combustion chemistry or experimental observations.

The output results produced in step 110 of FIG. 1 may comprise a representation of the calculated Damköhler numbers, such as tabulated values associated with individual cells, or contours of local Damköhler numbers presented in two- or three-dimensional plots. In one example output representation, individual cells may be represented using different colors (or shades of colors) according to their Damköhler numbers. The output results may be further presented based on a comparison between the calculated and critical Da values. For example, one representation may only comprise cells with Damköhler numbers that are greater than the critical Da value, designating localities in which LBO is more likely to occur. Additionally, or alternatively, the output representation may comprise binary indicators, with cell-level granularity (e.g., on linear or logarithmic scales), to designate cells that either meet or do no meet the LBO threshold conditions. In another example output representation, additional parameters, such as cell residence and chemical times may be produced as part of the output representation. Locations without a Damköhler number may also be tagged to designate cells that were not selected for processing.

Figure 3:
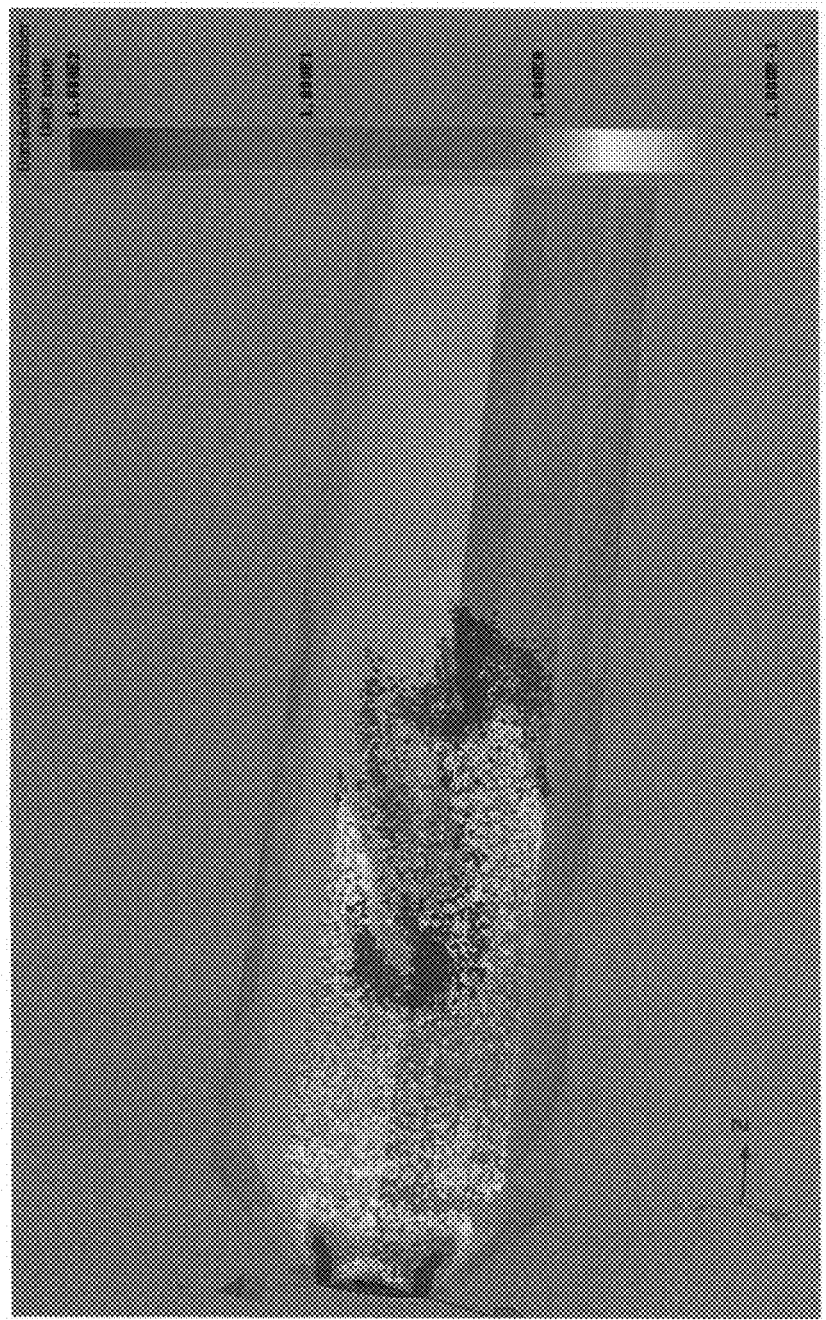
FIG. 3 illustrates a plot representing Damköhler numbers in accordance with an exemplary embodiment of the present invention.

By examining the distribution, location and topology of Damköhler numbers and associated parameters, the flame core location, the integrity of the flame, and the likelihood of blow-off may be evaluated with cell-level granularity. For example, a stable flame may comprise blow-off cells that are primarily located around the perimeter of the flame zone. Therefore, if an LBO output representation indicates a significant number of blow-off cells within the flame core, the flame may be considered at or near its lean blow-off limit. FIG. 3 is an exemplary 3-dimensional diagram that illustrates the spatial distribution and values of Damköhler numbers. Examination of FIG. 3 reveals the location and distribution of cells that are near flame blow-off (i.e., Damköhler numbers of close to 1), as well as areas where blow-off is more likely (i.e., Damköhler numbers of greater than 1) and less likely (i.e., Damköhler numbers of less than 1) to occur.

Various embodiments described herein are described in the general context of method steps or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. A method for determining flame blow-off conditions for a fuel-oxidant mixture in a combustor, comprising:
    selecting a plurality of cells from a region within said combustor;
    obtaining a plurality of Damköhler numbers in accordance with detailed combustion chemistry and detailed flow dynamics associated with each of said plurality of cells;
    providing an output representation associated with said Damköhler numbers; and
    determining flame blow-off conditions in accordance with said output representation,
    wherein each of said Damköhler numbers is obtained by dividing a chemical time by a residence time associated with each cell,
    wherein said residence time is selected in accordance with at least one of a mean flow residence-time value or a turbulent flow residence timescale value associated with a cell, and
    wherein said residence time is selected to be the minimum of said mean flow residence-time value and said turbulent flow timescale value.

2. The method of claim 1, wherein one or more of said cells is selected in accordance with a sampling method.

3. The method of claim 1, wherein the maximum number of cells to be considered is a user defined parameter.

4. The method of claim 1, wherein at least one of said cells is selected from at least one of a flame and a pre-flame zones within said combustor.

5. The method of claim 4, said flame and pre-flame zones are defined by a user.

6. The method of claim 4, said flame and pre-flame zones are determined in accordance with computational fluid dynamics (CFD) computations.

7. The method of claim 1, wherein said mean flow residence-time value is obtained by (1) dividing volume of said cell by cross-flow area associated with said cell, then (2) dividing the resulting value by the magnitude of mean flow velocity of the mixture.

8. The method of claim 1, wherein said turbulent flow residence timescale value is obtained in accordance with turbulence kinetic energy and dissipation function associated with said cell.

9. The method of claim 1, wherein said determining is carried out in accordance with a critical Damköhler number.

10. The method of claim 9, wherein said critical Damköhler number is one.

11. The method of claim 9, wherein said critical Damköhler number is a user-defined value.

12. The method of claim 1, wherein said output representation comprises a contour of Damköhler numbers associated with each cell.

13. The method of claim 1, wherein said output representation comprises cells with Damköhler numbers that are greater than a critical Damköhler number.

14. The method of claim 1, wherein said output representation comprises a likelihood measure associated with producing flame blow-off with cell-level granularity.

15. The method of claim 1, wherein said output representation comprises residence and chemical times.

16. The method of claim 1, wherein said output representation is used to assess flame stability within said region.

17. A method for determining flame blow-off conditions for a fuel-oxidant mixture in a combustor, comprising:
selecting a plurality of cells from a region within said combustor;
obtaining a plurality of Damköhler numbers in accordance with detailed combustion chemistry and detailed flow dynamics associated with each of said plurality of cells;
providing an output representation associated with said Damköhler numbers; and
determining flame blow-off conditions in accordance with said output representation,
wherein each of said Damköhler numbers is obtained by dividing a chemical time by a residence time associated with each cell, and
wherein said chemical time is obtained by dividing a change in sensible enthalpy by a heat release rate associated with said cell.

18. The method of claim 17, wherein one or more of said cells is selected in accordance with a sampling method.

19. The method of claim 17, wherein at least one of said cells is selected from at least one of a flame and a pre-flame zones within said combustor.

20. The method of claim 17, wherein said residence time is selected in accordance with at least one of a mean flow residence-time value or a turbulent flow residence timescale value associated with a cell, and wherein said mean flow residence-time value is obtained by (1) dividing volume of said cell by cross-flow area associated with said cell, then (2) dividing the resulting value by the magnitude of mean flow velocity of the mixture.

21. The method of claim 17, wherein said residence time is selected in accordance with at least one of a mean flow residence-time value or a turbulent flow residence timescale value associated with a cell, and wherein said turbulent flow residence timescale value is obtained in accordance with turbulence kinetic energy and dissipation function associated with said cell.

22. The method of claim 17, wherein said determining is carried out in accordance with a critical Damköhler number.

23. The method of claim 22, wherein said critical Damköhler number is one.

24. The method of claim 17, wherein said output representation comprises a contour of Damköhler numbers associated with each cell.

25. The method of claim 17, wherein said output representation comprises cells with Damköhler numbers that are greater than a critical Damköhler number.

26. The method of claim 17, wherein said output representation comprises a likelihood measure associated with producing flame blow-off with cell-level granularity.

27. The method of claim 17, wherein said output representation comprises residence and chemical times.

28. The method of claim 17, wherein said output representation is used to assess flame stability within said region.

29. A computer program product embodied on a non-transitory, non-transmissible computer-readable medium, configured to command one or more data processors to execute steps comprising:
selecting a plurality of cells from a region within a combustor;
obtaining a plurality of Damköhler numbers in accordance with detailed combustion chemistry and detailed flow dynamics associated with each of said plurality of cells;
providing an output representation associated with said Damköhler numbers; and
determining flame blow-off conditions in accordance with said output representation,
wherein each of said Damköhler numbers is obtained by dividing a chemical time by a residence time associated with each cell,
wherein said residence time is selected in accordance with at least one of a mean flow residence-time value or a turbulent flow residence timescale value associated with a cell, and
wherein said residence time is selected to be the minimum of said mean flow residence-time value and said turbulent flow timescale value.

30. The computer program product of claim 29, wherein at least one of said cells is selected from at least one of a flame and a pre-flame zones within said combustor.

31. The computer program product of claim 29, wherein said mean flow residence-time value is obtained by (1) dividing volume of said cell by cross-flow area associated with said cell, then (2) dividing the resulting value by the magnitude of mean flow velocity of the mixture.

32. The computer program product of claim 29, wherein said turbulent flow residence timescale value is obtained in accordance with turbulence kinetic energy and dissipation function associated with said cell.

33. The computer program product of claim 29, wherein said determining is carried out in accordance with a critical Damköhler number.

34. The computer program product of claim 29, wherein said output representation comprises a likelihood measure associated with producing flame blow-off with cell-level granularity.

35. The computer program product of claim 29, wherein said output representation comprises residence and chemical times.

36. A computer program product embodied on a non-transitory, non-transmissible computer-readable medium configured to command one or more data processors to execute steps, comprising:
selecting a plurality of cells from a region within a combustor;
obtaining a plurality of Damköhler numbers in accordance with detailed combustion chemistry and detailed flow dynamics associated with each of said plurality of cells;
providing an output representation associated with said Damköhler numbers; and determining flame blow-off conditions in accordance with said output representation, wherein each of said Damköhler numbers is obtained by dividing a chemical time by a residence time associated with each cell, and wherein said chemical time is obtained by dividing a change in sensible enthalpy by a heat release rate associated with said cell.

37. The computer program product of claim 36, wherein at least one of said cells is selected from at least one of a flame and a pre-flame zones within said combustor.

38. The computer program product of claim 36, wherein said residence time is selected in accordance with at least one of a mean flow residence-time value or a turbulent flow residence timescale value associated with a cell, and wherein said mean flow residence-time value is obtained by (1) dividing volume of said cell by cross-flow area associated with said cell, then (2) dividing the resulting value by the magnitude of mean flow velocity of the mixture.

39. The computer program product of claim 36, wherein said residence time is selected in accordance with at least one of a mean flow residence-time value or a turbulent flow residence timescale value associated with a cell, and wherein said turbulent flow residence timescale value is obtained in accordance with turbulence kinetic energy and dissipation function associated with said cell.

40. The computer program product of claim 36, wherein said determining is carried out in accordance with a critical Damköhler number.

41. The computer program product of claim 36, wherein said output representation comprises a likelihood measure associated with producing flame blow-off with cell-level granularity.

42. The computer program product of claim 36, wherein said output representation comprises residence and chemical times.

* * * * *